United States Patent
Xia

(10) Patent No.: US 8,085,581 B2
(45) Date of Patent: Dec. 27, 2011

(54) STT-MRAM BIT CELL HAVING A RECTANGULAR BOTTOM ELECTRODE PLATE AND IMPROVED BOTTOM ELECTRODE PLATE WIDTH AND INTERCONNECT METAL WIDTHS

(75) Inventor: William Xia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 496 days.

(21) Appl. No.: 12/200,207

(22) Filed: Aug. 28, 2008

(65) Prior Publication Data

US 2010/0054028 A1 Mar. 4, 2010

(51) Int. Cl.
*G11C 11/00* (2006.01)
(52) U.S. Cl. .......... 365/158; 365/171; 365/173
(58) Field of Classification Search .......... 365/158, 365/171, 173
See application file for complete search history.

(56) References Cited

U.S. PATENT DOCUMENTS

| | | | |
|---|---|---|---|
| 6,977,181 B1 * | 12/2005 | Raberg | 438/3 |
| 2006/0034117 A1 * | 2/2006 | Jeong et al. | 365/158 |
| 2006/0083054 A1 | 4/2006 | Jeong | |
| 2007/0159870 A1 | 7/2007 | Tanizaki et al. | |
| 2007/0263431 A1 * | 11/2007 | Jeong | 365/158 |
| 2007/0297222 A1 * | 12/2007 | Leuschner | 365/171 |

FOREIGN PATENT DOCUMENTS

EP 1542276 A2 6/2005

OTHER PUBLICATIONS

International Search Report and Written Opinion—PCT/US2009/054756, International Search Authority—European Patent Office—Nov. 4, 2009.

Petrov D K et al., "Enhanced magnetoresistance in sintered granular manganite/insulator systems" Applied Physics Letters, AIP, American Institute of Physics, Melville, NY, US, vol. 75, No. 7, Aug. 16, 1999, pp. 995-997, XP012024612, ISSN: 0003-6951.

* cited by examiner

*Primary Examiner* — Son Dinh
(74) *Attorney, Agent, or Firm* — Sam Talpalatsky; Michelle Gallardo; Jonathan T. Velasco

(57) ABSTRACT

A Spin Transfer Torque Magnetoresistive Random Access Memory (STT-MRAM) bit cell is provided. The STT-MRAM includes a rectangular bottom electrode (BE) plate, and a storage element on the rectangular bottom electrode (BE) plate. A difference between a width of the rectangular bottom electrode (BE) plate and a width of the storage element is equal to or greater than a predetermined minimum spacing requirement. A width of the bottom electrode (BE) plate is substantially equal to a width of an active layer or a width of a plurality of metal layers.

22 Claims, 9 Drawing Sheets

STT-MRAM BIT CELL HAVING A RECTANGULAR BOTTOM ELECTRODE PLATE AND IMPROVED BOTTOM ELECTRODE PLATE WIDTH AND INTERCONNECT METAL WIDTHS

FIELD OF DISCLOSURE

Exemplary embodiments of the invention are directed to structural designs of Magnetoresistive Random Access Memory (MRAM) bit cells. More particularly, embodiments of the invention are related to structural designs of Spin Transfer Torque Magnetoresistive Random Access Memory (STT-MRAM) bit cells having a rectangular bottom electrode (BE) plate, and wherein the bottom electrode (BE) plate, the active layer, and the M1 to M6 metal layers have substantially the same width.

BACKGROUND

Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

Referring to FIG. 1, a diagram of a conventional STT-MRAM cell 100 is illustrated. The STT-MRAM bit cell 100 includes a magnetic tunnel junction (MTJ) storage element 105, transistor 110, bit line 120, and word line 130. The MTJ storage element 105 is formed, for example, from a pinned layer and a free layer, each of which can hold a magnetic field, separated by an insulating (tunnel barrier) layer as illustrated in FIG. 1. The STT-MRAM bit cell 100 also includes a source line 140, sense amplifier 150, read/write circuitry 160 and bit line reference 170. The source line 140 is connected via a pad (not shown) to the lower portion 114 of the transistor 110.

Those skilled in the art will appreciate that the magnetic tunnel junction (MTJ) storage element 105 is grown on an additional metal layer known as a bottom electrode (BE) plate 180, which is connected via a seed (not shown) to the upper portion 112 of the transistor 110. The mechanical surface properties of the BE plate 180, such as the surface flatness or roughness, affect the performance of the MTJ storage element 105. The BE plate 180 generally is formed from a rigid, polished metal, such as a titanium alloy or like metal having mechanical properties suitable for forming the MTJ storage element 105 thereon.

With reference to FIGS. 1 and 2, a conventional STT-MRAM cell 100 has a magnetic tunnel junction (MTJ) storage element 105 formed on a hexagonal (or octagonal) bottom electrode (BE) plate 180. The STT-MRAM cell 100 also has a seed 190 that connects the BE plate 180 to the upper portion 112 of the transistor 110.

As shown in FIG. 2, in conventional, non-symmetric STT-MRAM cell array designs, the corners of the bottom electrode (BE) plate 180 are removed or etched off to form the hexagonal (or octagonal) shape in order to maintain reduce spacing requirements between adjacent BE plates in the conventional STT-MRAM cell array. The hexagonal bottom electrode (BE) plate 180 has a width X0 and a height Y0. In conventional STT-MRAM cells, the BE plate width X0, active layer width, and metal widths are substantially different, as can be seen in FIG. 2.

Those skilled in the art will appreciate the operation and construction of the memory cell 100 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

SUMMARY

Exemplary embodiments of the invention are directed to structural designs of Magnetoresistive Random Access Memory (MRAM) bit cells. More particularly, embodiments of the invention are related to structural designs of Spin Transfer Torque Magnetoresistive Random Access Memory (STT-MRAM) bit cells having a rectangular bottom electrode plate, and wherein the bottom electrode plate, the active layer, and the M1 to M6 metal layers have substantially the same width.

An embodiment of the present invention recognizes that the conventional hexagonal BE plate has disadvantages, particularly when a source line (SL) is parallel to a bit line in a STT-MRAM bit cell array structure. The width X0 and a height Y0 of the hexagonal bottom electrode (BE) plate 180 and the minimum spacing requirements between the STT-MRAM cells directly affect the area efficiency of the STT-MRAM cell array. The angled shape of the hexagonal BE plate results in limitations in the size of the STT-MRAM cell in the X and Y directions, thereby limiting the possible designs of the STT-MRAM cell. It will be appreciated that the minimum spacing requirement may be specified by design standard for various manufactures and may vary based on materials, scale, operating parameters, and the like.

An embodiment of the present invention is directed to a rectangular (or square) bottom electrode (BE) plate within a STT-MRAM cell. The rectangular BE plate according to the embodiments can improve the area efficiency of the STT-MRAM bit cell and the STT-MRAM bit cell array. That is, the exemplary embodiments of a rectangular BE plate design can reduce the area of the STT-MRAM cell compared to the conventional STT-MRAM cell designs, even when the same spacing rules are maintained, by providing a rectangular bottom electrode (BE) plate. The exemplary embodiments of a rectangular BE plate design can further reduce the area of the STT-MRAM cell and the STT-MRAM bit cell array by forming the BE plate, active layer, and/or metal layers to have a substantially equal width.

An embodiment of the present invention also recognizes that the MTJ storage element generally has a rectangular shape because of the complexities associated with forming such MTJ storage elements. The embodiments of the present invention can provide a rectangular (or square) bottom electrode (BE) plate that corresponds more closely to the rectangular shape of the MTJ storage element, thereby improving the efficiency of the STT-MRAM bit cell area and the STT-MRAM bit cell array.

The exemplary embodiments of a rectangular BE plate design can simplify STT-MRAM bit cell designs, reduce average bit cell sizes, and improve MTJ current density and distribution. The exemplary embodiments also can improve control of mechanical properties of the BE plate, thereby improving the performance of an MTJ storage element formed or grown on the BE plate. For example, the embodiments of the rectangular BE plate can provide advantages such as reduced surface or edge roughness, reduced resistance, and increased symmetry, which can improve the performance of the MTJ storage element in the STT-MRAM bit cell.

The embodiments of the present invention can avoid the complex geometry of the conventional STT-MRAM bit cell arrays by symmetrically arranging the STT-MRAM bit cells and controlling mismatch between the STT-MRAM bit cells. Each STT-MRAM bit cell can perform or behave substantially the same as the other STT-MRAM bit cells in the array, such that the mismatch of the STT-MRAM bit cell array, as a whole, is thereby improved.

For example, an exemplary embodiment is directed to a Spin Transfer Torque Magnetoresistive Random Access Memory (STT-MRAM) bit cell including a rectangular bottom electrode (BE) plate, and a storage element on the rectangular bottom electrode (BE) plate. A difference between a width of the rectangular bottom electrode (BE) plate and a width of the storage element is substantially equal to or greater than a predetermined minimum spacing requirement.

In another exemplary embodiment, a Spin Transfer Torque Magnetoresistive Random Access Memory (STT-MRAM) bit cell includes a rectangular bottom electrode (BE) plate, a storage element on the rectangular bottom electrode (BE) plate, an active layer, and a plurality of metal layers. A width of the bottom electrode (BE) plate is substantially equal to a width of the active layer or a width of one of the plurality of metal layers.

In another exemplary embodiment, a Spin Transfer Torque Magnetoresistive Random Access Memory (STT-MRAM) bit cell array includes a plurality of STT-MRAM bit cells, in which each of the plurality of STT-MRAM bit cells includes a storage element, a rectangular bottom electrode (BE) plate, an active layer, and a plurality of metal layers. A width of the bottom electrode (BE) plate is substantially equal to a width of the active layer or a width of one of the plurality of metal layers.

Another exemplary embodiment is directed to a method of forming a Spin Transfer Torque Magnetoresistive Random Access Memory (STT-MRAM) bit cell. The method includes forming a rectangular bottom electrode (BE) plate, forming a storage element on the rectangular bottom electrode (BE) plate, and forming an active layer and a plurality of metal layers. A width of the bottom electrode (BE) plate is substantially equal to a width of the active layer or a width of one of the plurality of metal layers.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation. Further, certain terminology, such as "on" (e.g., as in mounted 'on') and "substantially" are used in a broad manner herein. For example, the term "on" is intended to include, for example, an element or layer that is directly on another element or layer, but could alternatively include intervening layers between the elements/layers.

With reference to FIGS. 3-9, exemplary embodiments of structural designs of Magnetoresistive Random Access Memory (MRAM) bit cells, and more particularly, structural designs of Spin Transfer Torque Magnetoresistive Random Access Memory (STT-MRAM) bit cells, will now be described.

Figure 1:
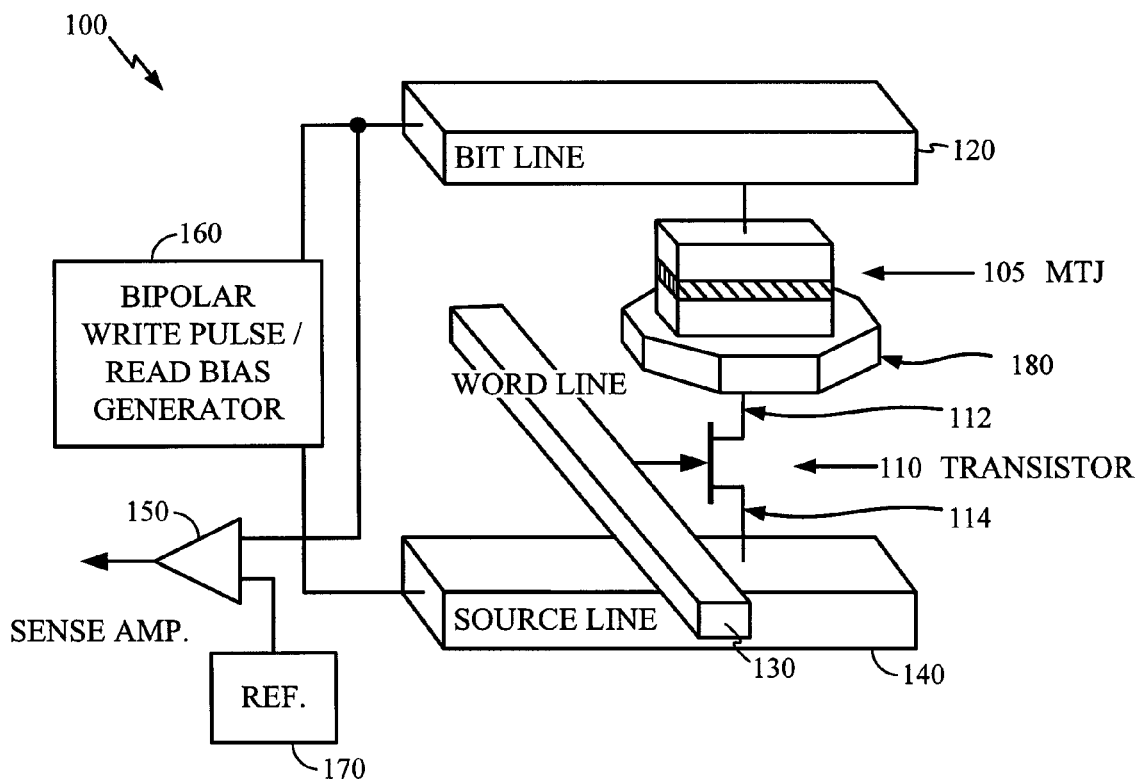
FIG. 1 illustrates a conventional Spin Transfer Torque Magnetoresistive Random Access Memory (STT-MRAM) cell.
Figure 2:
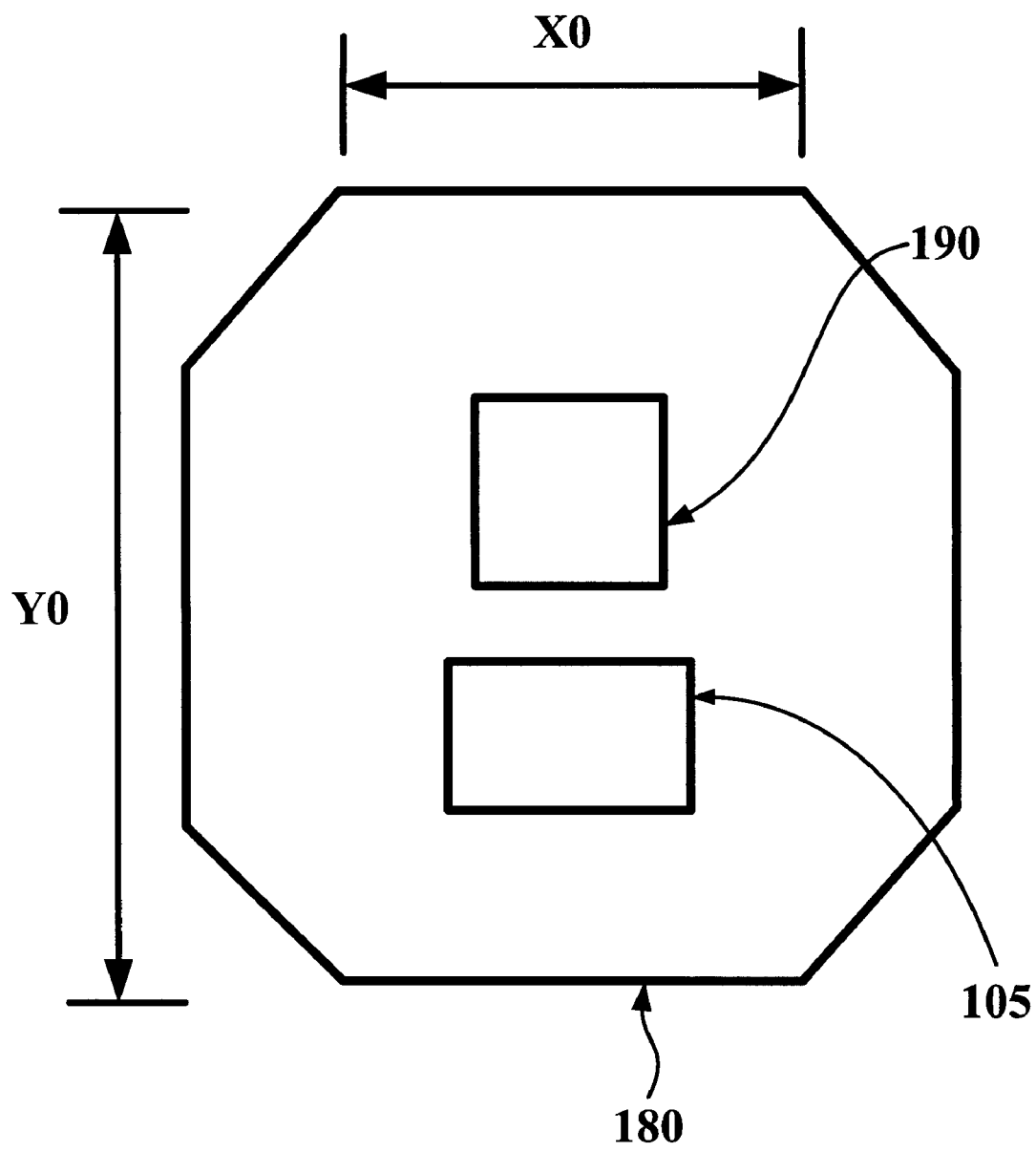
FIG. 2 is a top down plan view of a partial conventional STT-MRAM bit cell.
Figure 3:
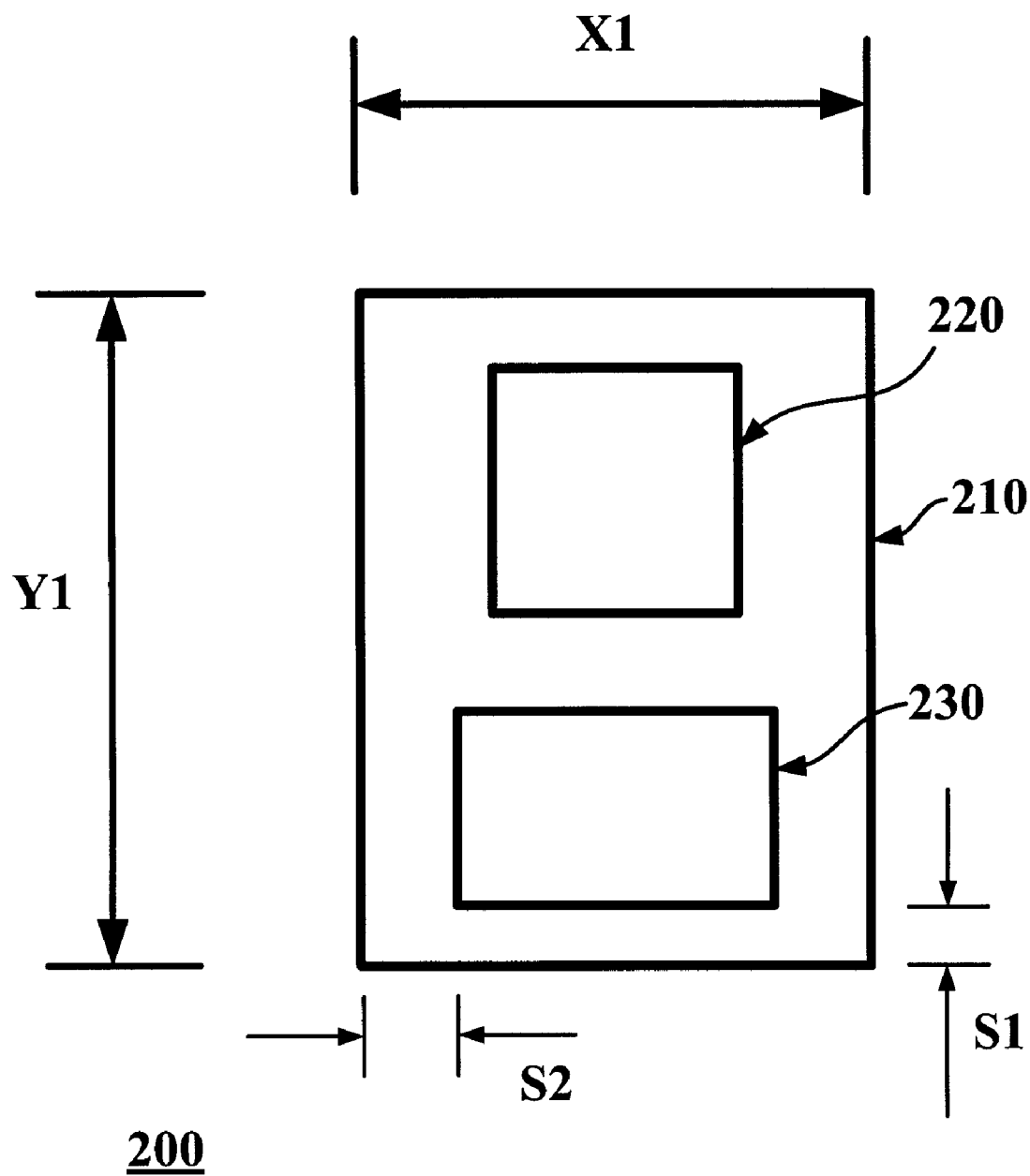
FIG. 3 is a schematic top down plan view of a partial STT-MRAM bit cell having a rectangular bottom electrode (BE) plate according to an exemplary embodiment.

FIG. 3 illustrates an exemplary embodiment of a partial STT-MRAM bit cell 200 having a bottom electrode (BE) plate 210, a seed 220, and a magnetic tunnel junction (MTJ) storage element 230. Instead of a hexagonal BE plate as shown in the conventional STT-MRAM cell shown in FIGS. 1 and 2, the bottom electrode (BE) plate 210 according to an exemplary embodiment has a rectangular shape. The rectangular BE plate 210 has a width X1 and a height Y1, such that the width X1 and/or height Y1 of the STT-MRAM bit cell 200 can be reduced. The minimum spacing requirements between the edge of the MTJ storage element 230 and the edge of the BE plate 210 are shown by S1 and S2.

As shown in FIG. 3, the embodiments can provide a rectangular (e.g., square) bottom electrode (BE) plate 210 that corresponds more closely to the rectangular shape of the MTJ storage element 230, thereby improving the area efficiency of the STT-MRAM bit cell 200. In this way, the width X1 of the rectangular BE plate shown in FIG. 3 can be less than the width X0 of the conventional hexagonal BE plate shown in FIG. 2, thereby reducing the STT-MRAM cell area. In another embodiment, the height Y1 of the rectangular BE plate shown in FIG. 3 also can be less than the height Y0 of the conventional hexagonal BE plate shown in FIG. 2, thereby further reducing and optimizing the STT-MRAM cell area.

For example, an exemplary embodiment is directed to a Spin Transfer Torque Magnetoresistive Random Access Memory (STT-MRAM) bit cell including a rectangular bottom electrode (BE) plate, and a storage element on the rectangular bottom electrode (BE) plate. A difference between a width of the rectangular bottom electrode (BE) plate and a width of the storage element is substantially equal to or greater than a minimum spacing requirement for the STT-MRAM cell.

Figure 4:
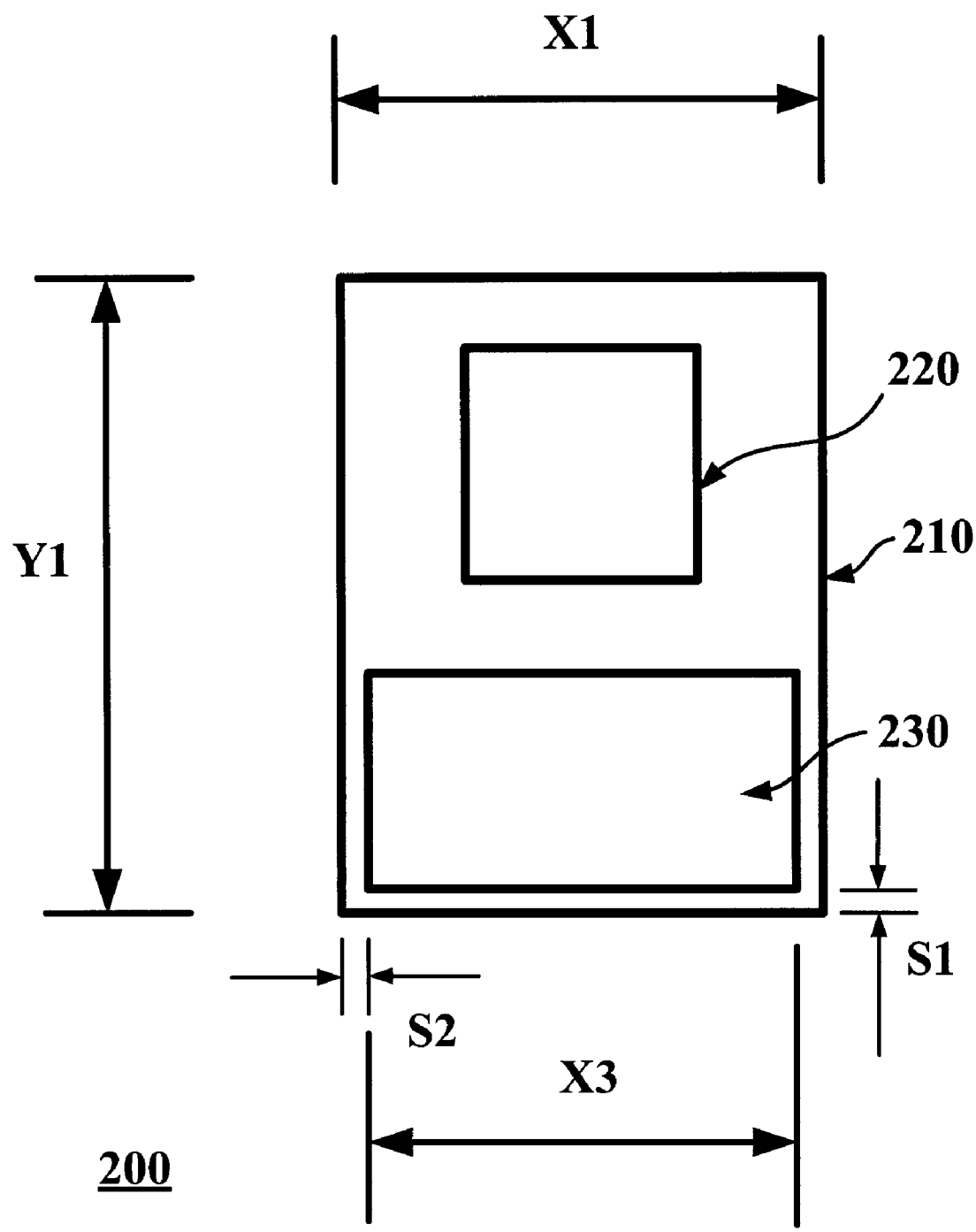
FIG. 4 is a schematic top down plan view of a partial STT-MRAM bit cell having a rectangular bottom electrode (BE) plate according to another exemplary embodiment.

FIG. 4 illustrates another exemplary embodiment of a partial STT-MRAM bit cell 200 having a bottom electrode (BE) plate 210, a seed 220, and a magnetic tunnel junction (MTJ) storage element 230. As shown in FIG. 4, the width X1 of the BE plate 210 can be substantially equal to the width X3 of the MTJ storage element 230, while maintaining minimum spacing requirements S1 and S2 between the edge of the MTJ storage element 230 and the edge of the BE plate 210. This embodiment can further reduce the area of the STT-MRAM bit cell 200.

Generally, a target ratio of the width of the MTJ storage element 230 to the height of the MTJ storage element 230 can be, for example, approximately a 2 to 3 ratio. One of ordinary skill in the art will recognize that other ratios between the width and height of the MTJ storage element 230 are contemplated by other embodiments of the invention. In an exemplary embodiment, the width X1 of the rectangular BE plate 210 can be selected to be substantially equal to the width X3 of the MTJ storage element 230, while maintaining minimum spacing requirements S1 and S2 between the edge of the MTJ storage element 230 and the edge of the BE plate 210. In another exemplary embodiment, the width X3 of the MTJ storage element 230 can be selected to be substantially equal to the width X1 of the rectangular BE plate 210. That is, the ratio of the width of the MTJ storage element 230 to the height of the MTJ storage element 230 can be varied to conform with the width X3 of the MTJ storage element 230 as compared to the width X1 of the rectangular BE plate 210.

For example, an exemplary embodiment is directed to a Spin Transfer Torque Magnetoresistive Random Access Memory (STT-MRAM) bit cell includes a rectangular bottom electrode (BE) plate, a storage element on the rectangular bottom electrode (BE) plate, an active layer, and a plurality of metal layers. A width of the bottom electrode (BE) plate is substantially equal to a width of the active layer or a width of one of the plurality of metal layers.

Figure 5:
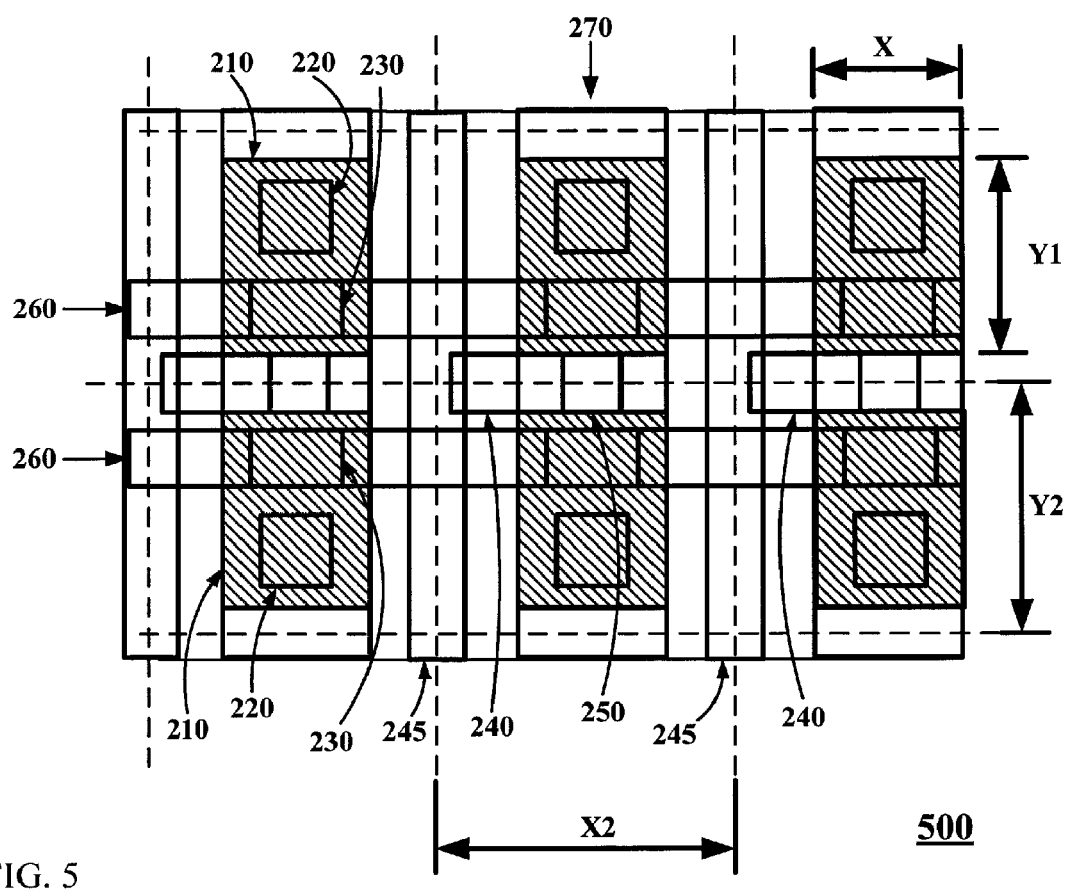
FIG. 5 is a schematic top down view of an STT-MRAM bit cell array according to an exemplary embodiment.

FIG. 5 illustrates an exemplary embodiment of a STT-MRAM bit cell array 500. The STT-MRAM bit cell array 500 can include a plurality of STT-MRAM bit cells 200, in which each STT-MRAM bit cell 200 has a bottom electrode (BE) plate 210, a seed 220, and a magnetic tunnel junction (MTJ) storage element 230. For clarification purposes only, the BE plates 210 are shown with cross-hatching. The seed 220 connects the rectangular BE plate 210 to the upper portion of the transistor. The pad 250 connects the STT-MRAM bit cell 200 to the source line 240, which can be connected to a common source line 245. The STT-MRAM bit cell array 500 also can include polysilicon lines 260 that run perpendicular to the common source lines 245, and bit lines 270 that run parallel to the common source lines 245.

For example, an exemplary embodiment is directed to a Spin Transfer Torque Magnetoresistive Random Access Memory (STT-MRAM) bit cell array includes a plurality of STT-MRAM bit cells, in which each of the plurality of STT-MRAM bit cells includes a storage element, a rectangular bottom electrode (BE) plate, an active layer, and a plurality of metal layers. A width of the bottom electrode (BE) plate is substantially equal to a width of the active layer or a width of one of the plurality of metal layers.

Figure 6:
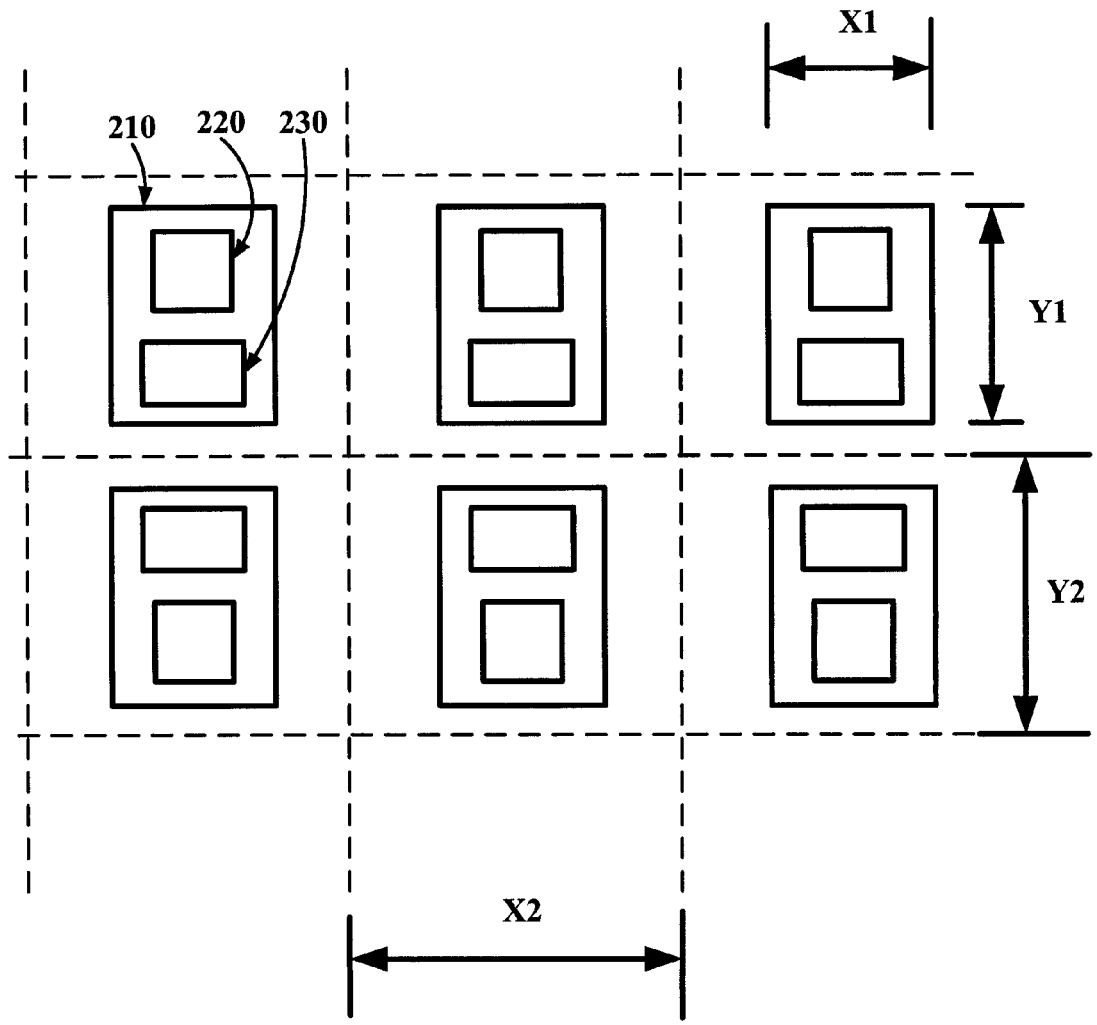
FIG. 6 is a schematic top down view of a partial STT-MRAM cell array according to an exemplary embodiment.

To further illustrate the improved area efficiency of the STT-MRAM bit cell array 500, FIG. 6 shows a partial STT-MRAM bit cell array 500 including a plurality of STT-MRAM bit cells 200, in which each STT-MRAM bit cell 200 has a bottom electrode (BE) plate 210, a seed 220, and a magnetic tunnel junction (MTJ) storage element 230.

As shown in FIGS. 5 and 6, the rectangular BE plate has a width X1 and a height Y1 such that the width and/or height of the STT-MRAM bit cell 200 can be reduced, thereby reducing the area of the STT-MRAM bit cell 200. By reducing the area of the STT-MRAM bit cell 200, the spacing X2 and Y2 of the STT-MRAM bit cell array 500 also can be reduced, thereby improving area efficiency of the STT-MRAM bit cell array 500 as compared to STT-MRAM bit cell arrays using the conventional hexagonal STT-MRAM bit cell 100.

As shown in the exemplary STT-MRAM bit cell array 500 of FIG. 5, the reduced area of the STT-MRAM bit cell 200 is particularly beneficial for improving the area efficiency of the STT-MRAM bit cell array 500 when the common source lines 245 are parallel to the bit lines 270, since minimum spacing requirements also are maintained between the source lines 245 and the BE plates 210.

In an embodiment, the STT-MRAM cell area can be further reduced by using the same, or substantially the same, width X1 for the rectangular BE plate, the active layer, and the metal lines (e.g., M1 to M6 metal lines). That is, the BE plate width, the active layer width, and the M1 to M6 metal width can be equal or substantially equal to each other, as exemplarily illustrated in FIGS. 4 and 6. According to this embodiment, the current density and distribution can be more uniform and have less resistance drop (IR drop).

In another embodiment, the STT-MRAM cell can be further simplified by symmetrically arranging the plurality of STT-MRAM bit cells 210 on opposite sides of the source line 240, as exemplarily shown in FIG. 5.

Figure 7:
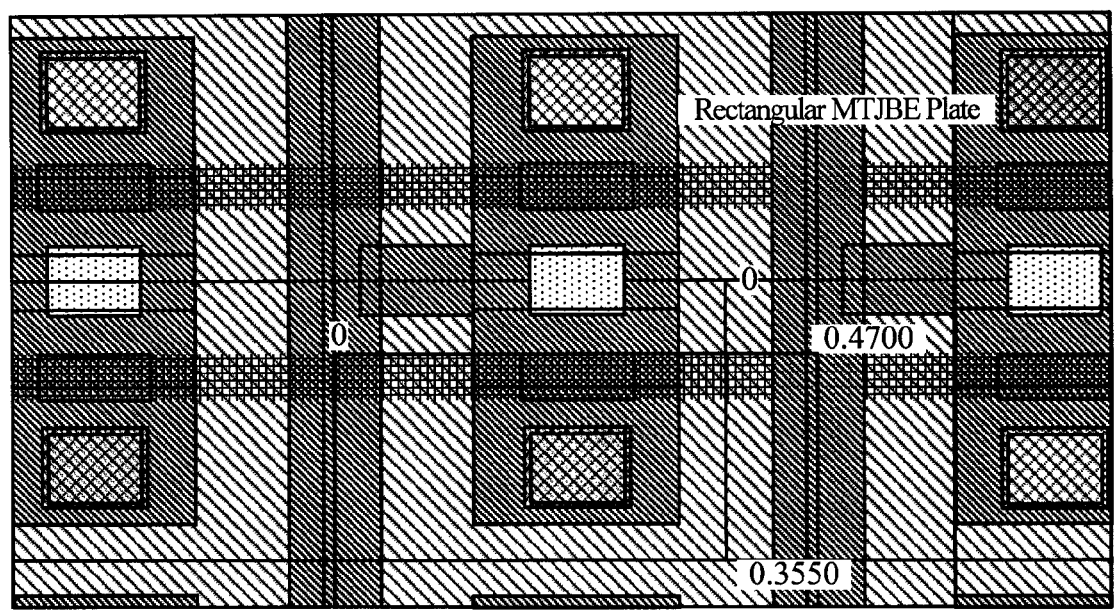
FIG. 7 is a top down screen view of an STT-MRAM cell array according to an exemplary embodiment.
Figure 8:
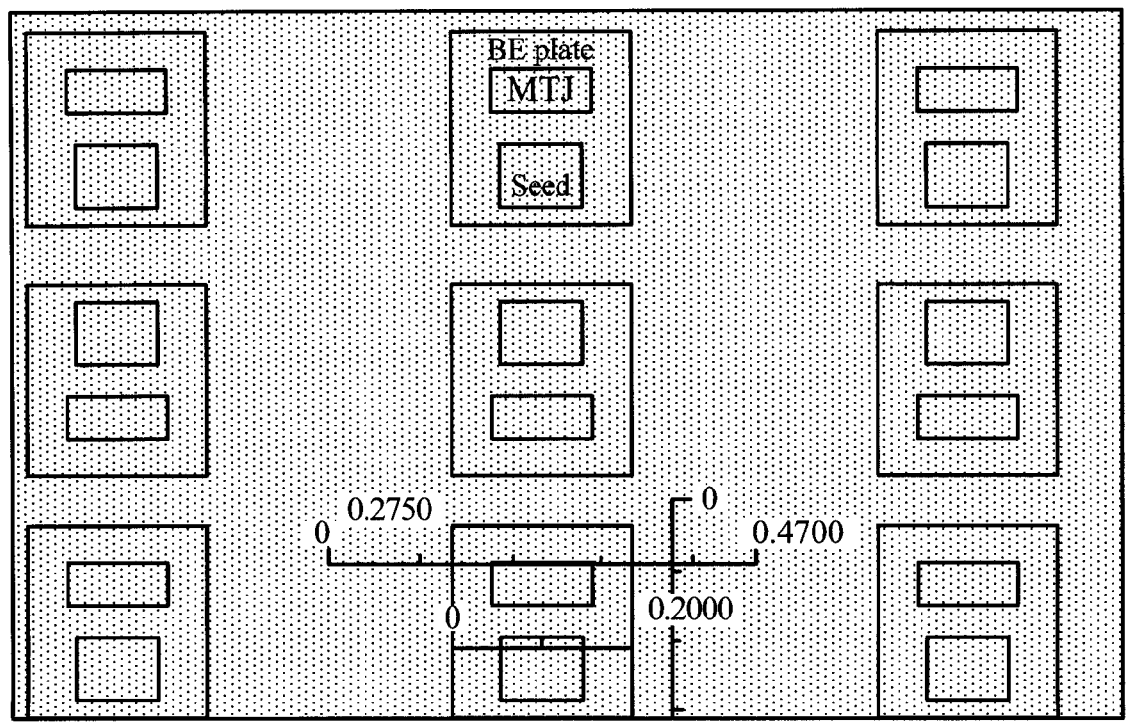
FIG. 8 shows a top down screen view of a partial STT-MRAM cell array according to an exemplary embodiment.

FIG. 7 shows a top down screen view of an STT-MRAM cell array according to an exemplary embodiment. FIG. 8 shows a top down screen view of a partial STT-MRAM cell array according to an exemplary embodiment. Although specific measurements are enumerated for convenience of illustration, it will be appreciated that embodiments of the invention are not limited to the enumerated examples.

The embodiment of the STT-MRAM bit cell 200 shown in FIG. 3 is depicted in FIGS. 5-8. However, one of ordinary skill in the art will recognize that other embodiments of the STT-MRAM bit cell 200, for example as shown in FIG. 4, can form the STT-MRAM bit cell array 500.

Figure 9:
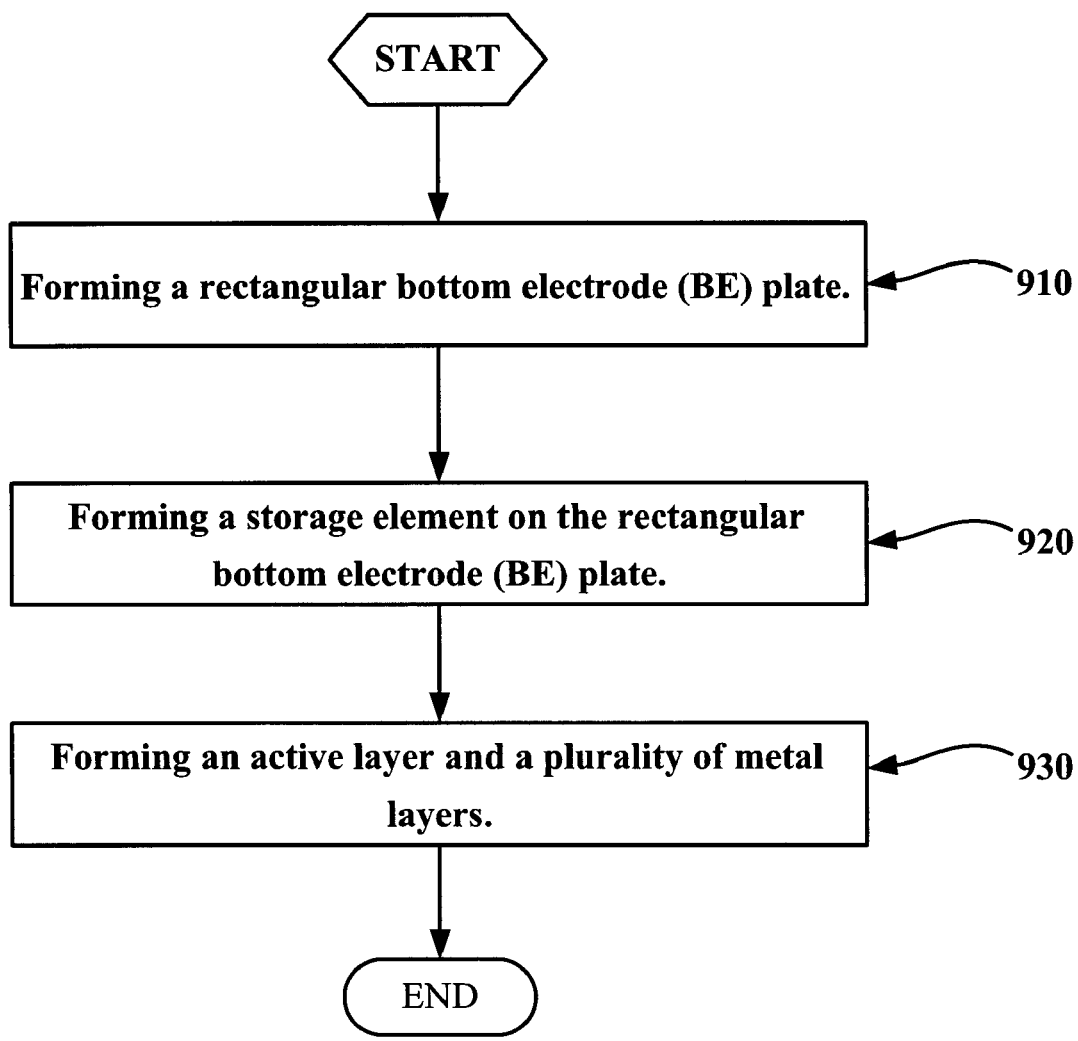
FIG. 9 shows a method of forming a STT-MRAM bit cell according to an exemplary embodiment.

As shown in FIG. 9, an exemplary embodiment is directed to a method of forming a STT-MRAM bit cell. The method includes forming a rectangular bottom electrode (BE) plate (e.g., step 910), forming a storage element on the rectangular bottom electrode (BE) plate (e.g., step 920), and forming an active layer and a plurality of metal layers (e.g., step 930). A width of the bottom electrode (BE) plate is substantially equal to a width of the active layer or a width of one of the plurality of metal layers. One of ordinary skill in the art will recognize that the steps of the method, such as forming, polishing, etching the rectangular BE plate, forming the MTJ storage element, and forming the active layer and metal layers, can be performed according to conventional methods.

According to the exemplary embodiments illustrated in FIGS. 3-9, the width X1 and height Y1 of the STT-MRAM bit cell 200 can be reduced, thereby improving area efficiency of the STT-MRAM cell 200. The spacing X2 and Y2 of the STT-MRAM bit cell array 500 also can be reduced, thereby improving area efficiency of the STT-MRAM bit cell array 500. For example, the STT-MRAM cell and STT-MRAM cell array, according to the exemplary embodiments, can improve area efficiency by about 10-15% as compared to the conventional designs.

According to the exemplary aspects, the rectangular BE plate design can reduce average bit cell sizes and MTJ current density and distribution. The exemplary embodiments also can provide a more controlled bottom electrode (BE) plate with mechanical properties that are beneficial for improving the performance of an MTJ storage element formed or grown thereon. For example, a exemplary BE plate can provide advantages such as reduced surface roughness, reduced resistance, and increased symmetry, which can improve the performance of the MTJ storage element in the STT-MRAM bit cell.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) bit cell comprising:
   a rectangular bottom electrode (BE) plate; and
   a storage element on the rectangular bottom electrode (BE) plate,
   wherein a difference between a width of the rectangular bottom electrode (BE) plate and a width of the storage element is substantially equal to or greater than a minimum spacing requirement.

2. The STT-MRAM bit cell of claim 1, wherein the difference between the width of the rectangular bottom electrode (BE) plate and the width of the storage element is substantially equal to the predetermined minimum spacing requirement.

3. The STT-MRAM bit cell of claim 1, wherein the storage element is a magnetic tunnel junction (MTJ) storage element.

4. The STT-MRAM bit cell of claim 1, further comprising:
   a polysilicon layer;
   a word line;
   a word line transistor coupled to the storage element.

5. The STT-MRAM bit cell of claim 4, wherein the word line transistor is coupled to the storage element via the rectangular bottom electrode (BE) plate.

6. The STT-MRAM bit cell of claim 4, wherein the word line transistor is coupled in series with the storage element.

7. The STT-MRAM bit cell of claim 4, further comprising:
   a storage element seed;
   a contact; and
   a via interconnect.

8. A Spin Transfer Torque Magnetoresistive Random Access Memory (STT-MRAM) bit cell comprising:
   a rectangular bottom electrode (BE) plate;
   a storage element on the rectangular bottom electrode (BE) plate;
   an active layer; and
   a plurality of metal layers,
   wherein a width of the bottom electrode (BE) plate is substantially equal to a width of the active layer or a width of one of the plurality of metal layers.

9. The STT-MRAM bit cell of claim 8, wherein a difference between a width of the rectangular bottom electrode (BE) plate and a width of the active layer or a width of the plurality of metal layers is equal to or greater than a predetermined minimum spacing requirement.

10. The STT-MRAM bit cell of claim 8, wherein the plurality of metal layers includes M1-M6 layers.

11. The STT-MRAM bit cell of claim 8, wherein the storage element is a magnetic tunnel junction (MTJ) storage element.

12. The STT-MRAM bit cell of claim 8, further comprising:
    a polysilicon layer;
    a word line; and
    a word line transistor coupled to the storage element.

13. The STT-MRAM bit cell of claim 12, wherein the word line transistor is coupled to the storage element via the rectangular bottom electrode (BE) plate.

14. The STT-MRAM bit cell of claim 12, wherein the word line transistor is coupled in series with the storage element.

15. The STT-MRAM bit cell of claim 12, further comprising:
    a storage element seed;
    a contact; and
    a via interconnect.

16. A Spin Transfer Torque Magnetoresistive Random Access Memory (STT-MRAM) bit cell array comprising:
    a plurality of STT-MRAM bit cells,
    wherein each of the plurality of STT-MRAM bit cells includes:
    a storage element;
    a rectangular bottom electrode (BE) plate;
    an active layer; and
    a plurality of metal layers,
    wherein a width of the bottom electrode (BE) plate is substantially equal to a width of the active layer or a width of one of the plurality of metal layers.

17. The STT-MRAM bit cell array of claim 16, wherein a width of the bottom electrode (BE) plate is substantially equal to a width of the storage element.

18. The STT-MRAM bit cell array of claim 16, wherein the plurality of metal layers includes M1-M6 layers.

19. The STT-MRAM bit cell array of claim 16, wherein the storage element is a magnetic tunnel junction (MTJ).

20. The STT-MRAM bit cell array of claim 16, further comprising:
    a source line,
    wherein the plurality of STT-MRAM bit cells are symmetrically arranged on opposite sides of the source line.

21. A method of forming a Spin Transfer Torque Magnetoresistive Random Access Memory (STT-MRAM) bit cell, the method comprising:
    forming a rectangular bottom electrode (BE) plate;
    forming a storage element on the rectangular bottom electrode (BE) plate; and
    forming an active layer and a plurality of metal layers,
    wherein a width of the bottom electrode (BE) plate is substantially equal to a width of the active layer or a width of one of the plurality of metal layers.

22. The method of claim 21, wherein a width of the bottom electrode (BE) plate is substantially equal to a width of the storage element.

* * * * *